(12) United States Patent
Uchida et al.

(10) Patent No.: US 8,455,968 B2
(45) Date of Patent: Jun. 4, 2013

(54) STORAGE ELEMENT AND MEMORY DEVICE

(75) Inventors: Hiroyuki Uchida, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/224,369

(22) Filed: Sep. 2, 2011

(65) Prior Publication Data

US 2012/0061780 A1    Mar. 15, 2012

(30) Foreign Application Priority Data

Sep. 13, 2010 (JP) .................. 2010-204372

(51) Int. Cl.
*H01L 43/02* (2006.01)

(52) U.S. Cl.
USPC .......................................... 257/421

(58) Field of Classification Search
USPC .......................................... 257/421
See application file for complete search history.

(56) References Cited

U.S. PATENT DOCUMENTS

| | | | |
|---|---|---|---|
| 6,256,223 B1 | 7/2001 | Sun | |
| 7,242,045 B2 | 7/2007 | Nguyen et al. | |
| 7,270,896 B2 * | 9/2007 | Parkin | 428/811.1 |
| 7,580,227 B2 * | 8/2009 | Sato et al. | 360/313 |
| 7,660,153 B2 * | 2/2010 | Yamane et al. | 365/171 |
| 7,719,071 B1 * | 5/2010 | Flatte et al. | 257/427 |
| 8,040,724 B2 * | 10/2011 | Suzuki et al. | 365/173 |
| 2008/0225581 A1 * | 9/2008 | Yamane et al. | 365/171 |

FOREIGN PATENT DOCUMENTS

| | | |
|---|---|---|
| JP | 2003-17782 | 1/2003 |
| JP | 2008-227388 | 9/2008 |

OTHER PUBLICATIONS

L. Berger, "Emission of spin waves by a magnetic multilayer traversed by a current", Physical Review B, vol. 54, No. 13, 1996.
J.C. Slonczewski, "Current-driven excitation of magnetic multilayers", Journal of Magnetism and Magnetic Material, 159, L1-L7, 1996.
Albert, et al., "Spin-polarized current switching of a Co thin film nanomagnet", Applied Physics Letters, vol. 77, No. 23, 2000.

* cited by examiner

*Primary Examiner* — Thao Le
(74) *Attorney, Agent, or Firm* — K&L Gates LLP

(57) ABSTRACT

Disclosed herein is a storage element, including: a storage layer which has magnetization vertical to a film surface and in which a direction of the magnetization is changed in correspondence to information; a magnetization fixing layer which has magnetization vertical to a film surface becoming a reference of the information stored in the storage layer, which is composed of plural magnetic layers, and which has a multilayered ferri-pin structure into which the plural magnetic layers are laminated one upon another through a non-magnetic layer(s); and an insulating layer made of a non-magnetic material and provided between the storage layer and the magnetization fixing layer.

8 Claims, 10 Drawing Sheets

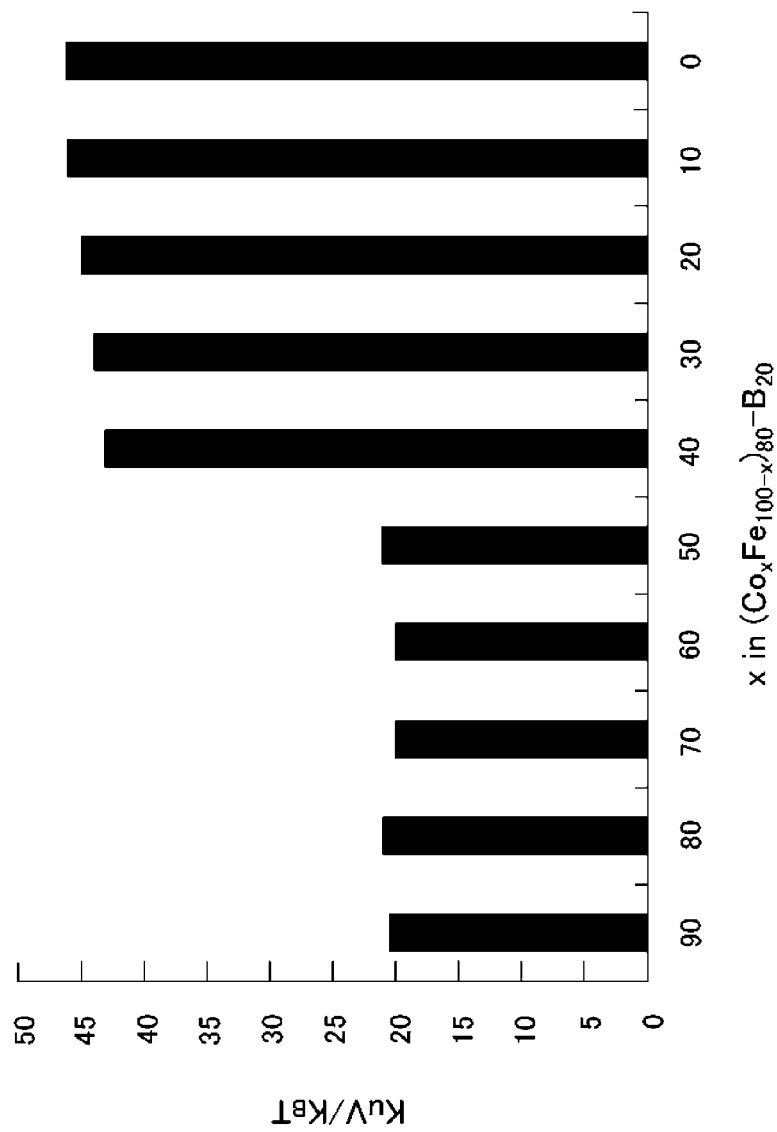
F I G . 5

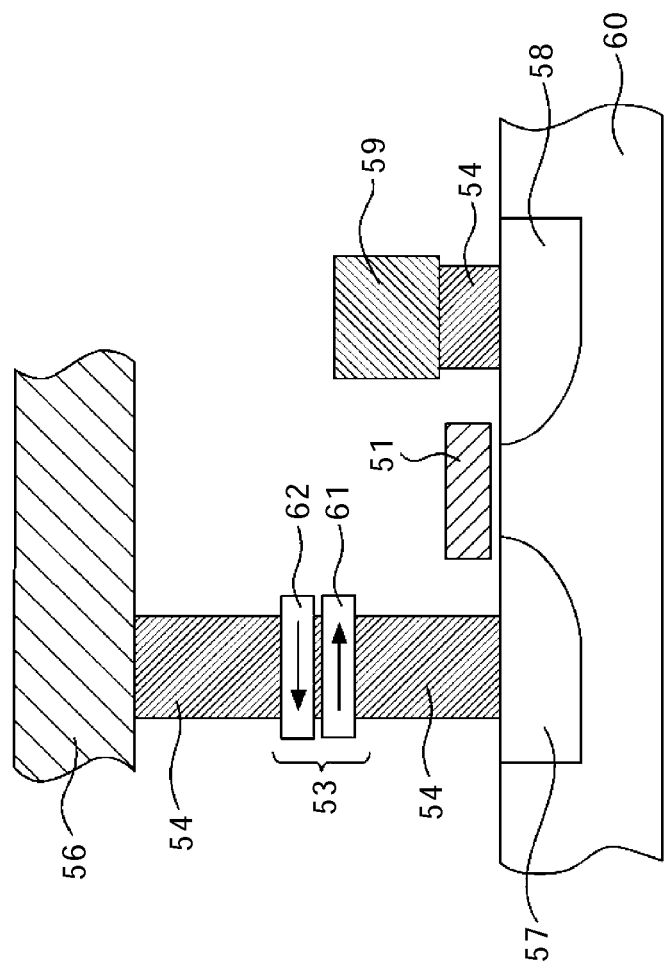

STORAGE ELEMENT AND MEMORY DEVICE

CROSS REFERENCES TO RELATED APPLICATIONS

The present application contains subject matter related to that disclosed in Japanese Priority Patent Application JP 2010-204372 filed in the Japan Patent Office on Sep. 13, 2010, the entire content of which is hereby incorporated by reference.

BACKGROUND

The present application relates to a storage element having a storage layer for storing a magnetization state of a ferromagnetic layer as information, and a magnetization fixing layer in which a direction of magnetization is fixed, and adapted to change the direction of the magnetization of the storage layer by causing a current to flow through the storage layer, and a memory device including the same.

A high-density DRAM (Dynamic Random Access Memory) which operates at a high speed is generally used as a random access memory in an information apparatus such as a computer.

However, since the DRAM is a volatile memory in which when a power source is turned OFF, information stored therein is erased, a non-volatile memory is desired in which information stored therein is not erased.

Also, a magnetic random access memory (MRAM) for recording therein information in accordance with magnetization of a magnetic material attracts attention as a candidate of the non-volatile memory, and the development of the MRAM is advanced.

In the MRAM, currents are caused to flow through two kinds of address wirings (a word line and a bit line) approximately bisecting at right angles with each other, respectively. Also, magnetization of a magnetic layer of a magnetic storage element disposed at an intersection point between the two kinds of address wirings is reversed by current magnetic fields generated from the two kinds of address wirings, thereby recording information.

FIG. 8 is a schematic view (perspective view) showing a structure of a general MRAM.

A drain region 108, a source region 107, and a gate electrode 101 composing a selecting transistor for selecting corresponding one of memory cells are formed in a portion which is isolated from other portions by an isolation layer 102 of a semiconductor substrate 110 such as a silicon substrate.

In addition, a word line 105 which extends in a front-back direction in FIG. 8 is provided above the gate electrode 101.

The drain region 108 is formed which the right-hand and left-hand side selecting transistors in FIG. 8 hold in common. Also, a wiring 109 is connected to the drain region 108.

Also, a magnetic storage element 103 is disposed between a word line 105 and a bit line 106 disposed above the word line 105 so as to extend in a horizontal direction in FIG. 8. In this case, the magnetic storage element 103 has a storage layer a direction of whose magnetization is adapted to be reversed. Also, the magnetic storage element 103, for example, is composed of a magnetic tunnel junction element (MTJ element).

In addition, the magnetic storage element 103 is electrically connected to the source region 107 through a bypass line 111 extending in a horizontal direction, and a contact layer 104 extending in a vertical direction.

Currents are caused to flow through the word line 105 and the bit line 106, respectively, to apply a current magnetic field to the magnetic storage element 103. As a result, the direction of the magnetization of the storage layer of the magnetic storage element 103 is reversed, thereby making it possible to record information.

Also, for stably holding the recorded information in the magnetic memory such as the MRAM, it is necessary for the magnetic layer (storage layer) for recording therein the information to have a given coercive force.

On the other hand, for rewriting the recorded information, a certain amount of current needs to be caused to flow through the address line.

However, a sufficient amount of current comes to be unable to be caused to flow because the address line becomes thin in accordance with the scale down of the elements composing the MRAM.

Then, with regard to the structure with which the magnetization reversal can be made with the less current, a memory having a structure in which the magnetization reversal by spin injection is utilized attracts attention. This technique, for example, is described in Japanese Patent Laid-Open No. 2003-17782, U.S. Pat. No. 6,256,223, and Japanese Patent Laid-Open No. 2008-227388, and a Non-patent Document of PHYs. Rev. B, 54. 9353 (1996) and a Non-patent Document of J. Magn. Mat., 159, L1 (1996).

The magnetization reversal by the spin injection is such that an electron which passes through a magnetic material to be spin-polarized is injected to another magnetic material, thereby causing the magnetization reversal in another magnetic material.

For example, a current is caused to flow in a direction vertical to a film surface through a giant magnetoresistance effect element (GMR element) or a magnetic tunnel junction element (MTJ element), thereby making it possible to reverse a direction of magnetization of at least a part of a magnetic layer of such an element.

Also, the magnetization reversal by the spin injection has an advantage that even when the element is scaled down, the magnetization reversal can be realized without increasing the current.

FIGS. 9 and 10 are respectively schematic views of a memory device having a structure in which the magnetization reversal by the spin injection described above is utilized. Here, FIG. 9 is a perspective view, and FIG. 10 is a cross sectional view.

A drain region 58, a source region 57, and a gate electrode 51 composing a selecting transistor for selecting corresponding one of memory cells are formed in a portion which is isolated from other portions by an isolation layer 52 of a semiconductor substrate 60 such as a silicon substrate. Of these constituent elements, the gate electrode 51 serves as a word line as well which extends in a front-back direction in FIG. 9.

The drain region 58 is formed which the right-hand and left-hand side selecting transistors in FIG. 9 hold in common. Also, a wiring 59 is connected to the drain region 58.

Also, a storage element 53 is disposed between the source region 57 and a bit line 56 disposed above the source region 57 and extending in a horizontal direction in FIG. 9. In this case, the magnetic storage element 53 has a storage layer a direction of whose magnetization is adapted to be reversed by the spin injection.

Also, the magnetic storage element 53, for example, is composed of the magnetic tunnel junction element (MTJ element). The storage element 53 has two magnetic layers 61 and 62. Of the two magnetic layers 61 and 62, one magnetic layer is used as a magnetization fixing layer the direction of whose magnetization is fixed, and the other is used as a magnetization free layer a direction of whose magnetization is adapted to be changed, that is, a storage layer.

In addition, the storage element 53 is connected to the bit line 56 and the source region 57 through an upper contact layer 54 and a lower contact layer 54, respectively. As a result, a current is caused to flow through the storage element 53, and thus the direction of the magnetization of the storage layer can be reversed by the spin injection.

In the case of the memory device having such a structure as to utilize the magnetization reversal by such spin injection, the device structure can be simplified as compared with the general MRAM shown in FIG. 8. For this reason, the memory device concerned has an advantage as well that the density growth becomes possible.

In addition, utilization of the magnetization reversal by the spin injection provides an advantage that even when the scale down of the element is advanced, a write current is not increased as compared with the general MRAM in which the magnetization reversal is carried out by an external magnetic field.

SUMMARY

Now, in the case of the MRAM, the write wirings (such as the word line and the bit line) are provided separately from the storage element. Also, the current magnetic field is generated by causing the currents to flow through the write wirings, respectively, thereby writing (recording) the information. For this reason, sufficient amounts of currents necessary for the writing operation can be caused to flow through the write wirings, respectively.

On the other hand, in the case of the memory device having such a structure as to utilize the magnetization reversal by the spin injection, it is necessary that the spin injection is carried out based on the current caused to flow through the storage element, thereby reversing the direction of the magnetization of the storage layer.

Also, the current is caused to directly flow through the storage element in such a way, thereby writing (recording) the information to(in) the storage element. Thus, for selecting a memory cell to which the information is to be written, the storage element is connected to the selecting transistor to configure the memory cell. In this case, the current caused to flow through the storage element is limited to a magnitude of a current (a saturation current of the selecting transistor) capable of being caused to flow through the selecting transistor.

For this reason, the writing operation needs to be carried out with the current equal to or smaller than the saturation current of the selecting transistor. Thus, an efficiency of the spin injection needs to be improved, thereby reducing the current caused to flow through the storage element.

In addition, for the purpose of increasing a level of a read-out signal, it is necessary to ensure a large magnetoresistance change rate. In order to attain this, it is effective to adopt such a structure of the storage element that a tunnel insulating layer (tunnel barrier layer) is used as an intermediate layer contacting both sides of the storage layer.

When the tunnel insulating layer is used as the intermediate layer in such a way, for the purpose of preventing the breakdown of the tunnel insulating layer from being caused, there is caused a limitation to an amount of current caused to flow through the storage element. From this viewpoint as well, it is necessary to suppress the current in the phase of the spin injection.

For reducing a value of this current, it is understood that since the current value is proportional to a thickness of the storage layer and is also proportional to the square of the saturation magnetization of the storage layer, it is only necessary to adjust these factors, that is, the thickness and the saturation magnetization. This technique, for example, is described in Non-patent Document of F. J. Albert et al., Apply. Phy. Lett., 77, 3809 (2000).

Also, for example, U.S. Pat. No. 7,242,045 (hereinafter referred to as Patent Document 1) shows that reduction of an amount Ms of magnetization of a recording material enables the current value to be reduced.

However, on the other hand, it may be impossible to obtain the characteristics of the non-volatile memory unless the information written by the current is stored. In a word, it is necessary to ensure the stability (thermal stability) against the thermal fluctuation of the storage layer.

In the case of the storage element utilizing the magnetization reversal by the spin injection, the volume of the storage layer becomes smaller than that of the storage layer in the case of the existing MRAM. Therefore, having a naive notion, the storage element utilizing the magnetization reversal by the spin injection has a tendency to show that the thermal stability is reduced.

When the thermal stability of the storage layer is not ensured, the direction of the reversed magnetization is caused to be re-reversed by the heat, which results in a write error.

Also, when the large capacity promotion of the storage element utilizing the magnetization reversal by the spin injection is advanced, since the volume of the storage element is further reduced, the ensuring of the thermal stability becomes an important problem.

For this reason, in the storage element utilizing the magnetization reversal by the spin injection, the thermal stability is very important characteristics.

Therefore, in order that the storage element having such a structure as to reverse the direction of the magnetization of the storage layer by the spin injection may exist as a memory, it is necessary to reduce the current necessary for the magnetization reversal by the spin injection to the saturation current or less of the transistor. Also, it is necessary to ensure the thermal stability with which the written information is securely held.

As described above, for reducing the current necessary for the magnetization reversal by the spin injection, it is expected that the amount Ms of saturation magnetization of the storage layer is reduced, and the storage layer is thinned. For example, as described in Patent Document 1, it is effective to use a material having a low amount Ms of saturation magnetization as a material of the storage layer. However, when the material having the low amount Ms of saturation magnetization is simply used, it may be impossible to ensure the thermal stability with which the information is securely held.

The present application has been made in order to solve the problems described above, and it is therefore desirable to provide a storage element in which thermal stability can be improved without increasing a write current, and a memory device including the same.

In addition, it is also desirable to strengthen perpendicular magnetic anisotropy of a magnetization fixing layer.

In order to attain the desire described above, according to an embodiment, there is provided a storage element including: a storage layer which has magnetization vertical to a film surface and in which a direction of the magnetization is changed in correspondence to information; a magnetization fixing layer which has magnetization vertical to a film surface becoming a reference of the information stored in the storage layer, which is composed of plural magnetic layers, and which has a multilayered ferri-pin structure into which the plural magnetic layers are laminated one upon another through a non-magnetic layer(s); and an insulating layer made of a non-magnetic material and provided between the storage layer and the magnetization fixing layer. In the storage element, the direction of the magnetization of the storage layer is changed by injecting spin-polarized electrons in a lamination direction of a layer structure having the storage layer, the insulating layer, and the magnetization fixing layer, thereby recording information in the storage layer; and a magnitude of an effective diamagnetic field which the storage layer receives is smaller than an amount of saturation magnetization of the storage layer.

In addition, a ferromagnetic layer material composing the storage layer is Co—Fe—B.

In this case, a composition of Co—Fe—B is $(Co_x Fe_y)_{100-z}B_z$ where $0 \leq Co_x \leq 40$, $60 \leq Fe_y \leq 100$, and $0 < B_z \leq 30$.

With the structure of the storage element according to the embodiment, the storage element has the storage layer for holding the information based on the magnetization state of the magnetic material, the magnetization fixing layer is provided on the storage layer through the intermediate layer, and the intermediate layer is made of the insulator. Also, the spin-polarized electrons are injected in the lamination direction to change the direction of the magnetization of the storage layer, thereby recording the information in the storage layer. Therefore, the current is caused to flow in the lamination direction to inject the spin-polarized electrons, thereby making it possible to record the information.

Also, since the magnitude of the effective diamagnetic field which the storage layer receives is smaller than the amount of saturation magnetization of the storage layer, the effective diamagnetic field which the storage layer receives is low. Thus, it is possible to reduce an amount of write current necessary to reverse the direction of the magnetization of the storage layer.

On the other hand, even when an amount of saturation magnetization of the storage layer is not reduced, it is possible to reduce an amount of write current. Therefore, the thermal stability of the storage layer can be sufficiently ensured with an amount of saturation magnetization of the storage layer as a sufficient amount.

In addition, the magnetization fixing layer has the multilayered ferri-pin structure. Therefore, the magnetization fixing layer is made to get dull against the external magnetic field, and the leakage magnetic field due to the fixing layer is cut off. Also, it is possible to strengthen the perpendicular magnetic anisotropy of the magnetization fixing layer due to the interlayer coupling among plural magnetic layers.

According to another embodiment, there is provided a memory device including: a storage element holding information based on a magnetization state of a magnetic material; and two kinds of wirings intersecting with each other. In memory device, the storage element includes: a storage layer which has magnetization vertical to a film surface and in which a direction of the magnetization is changed in correspondence to information; a magnetization fixing layer which has magnetization vertical to a film surface becoming a reference of the information stored in said storage layer, which is composed of plural magnetic layers, and which has a multilayered ferri-pin structure into which the plural magnetic layers are laminated one upon another through a non-magnetic layer(s); and an insulating layer made of a non-magnetic material and provided between the storage layer and the magnetization fixing layer. The direction of the magnetization of the storage layer is changed by injecting spin-polarized electrons in a lamination direction of a layer structure having the storage layer, the insulating layer, and the magnetization fixing layer, thereby recording information in the storage layer; and a magnitude of an effective diamagnetic field which the storage layer receives is smaller than an amount of saturation magnetization of the storage layer. The storage element is disposed between the two kinds of wirings; and a current is caused to flow through the storage element in the lamination direction through the two kinds of wirings, thereby injecting the spin-polarized electrons.

In addition, with the structure of the memory device according to the another embodiment, the storage element is disposed between the two kinds of wirings, the current in the multilayer direction is caused to flow through the storage element through the two kinds of wirings, and thus the spin-polarized electrons are injected. Therefore, the current in the multilayer direction is caused to flow through the storage element through the two kinds of wirings, thereby making it possible to record the information by the spin injection.

Also, since even when an amount of saturation magnetization of the storage layer is not reduced, it is possible to reduce an amount of write current of the storage element, it is possible to stably hold the information recorded in the storage element, and it is also possible to reduce the power consumption of the memory device.

As set forth hereinabove, according to the present application, even when an amount of saturation magnetization of the storage layer is not reduced, it becomes possible to reduce an amount of write current of the storage element. Therefore, the thermal stability as the information holding ability can be sufficiently ensured and thus the storage element which has the excellent characteristics balance can be structured. In addition, the magnetization fixing layer has the multilayered ferri-pin structure. Therefore, the magnetization fixing layer is made to get dull against the external magnetic field, and the leakage magnetic field due to the fixing layer is cut off. Also, it is possible to strengthen the perpendicular magnetic anisotropy of the magnetization fixing layer due to the interlayer coupling among plural magnetic layers. As a result, the operation error can be removed and thus the operation margin of the storage element can be sufficiently obtained.

Accordingly, it is possible to realize the highly reliable memory device which stably operates.

In addition, the write current can be reduced, thereby making it possible to reduce the power consumption when the information is written to the storage element.

Accordingly, it becomes possible to reduce the power consumption of the entire memory device.

Additional features and advantages are described herein, and will be apparent from the following Detailed Description and the figures.

BRIEF DESCRIPTION OF THE FIGURES

FIG. 5 is a graphical representation showing a relationship between an amount of Co of the storage layer having a diameter of 50 nm (storage element), and the index of the thermal stability;

FIG. 10 is a cross sectional view of the memory device shown in FIG. 9.

DETAILED DESCRIPTION

Embodiments of the present application will be described below in detail with reference to the drawings.

It is noted that the description will be given blow in accordance with the following order:
1. Storage Element (Outline);
2. Memory Device (Embodiment); and
3. Experiments.
1. Storage Element (Outline)

Firstly, an outline of a storage element in a memory device according to an embodiment will be described hereinafter.

In the storage element, a magnetization direction of a storage layer of the storage element is reversed by the spin injection previously stated, thereby recording information in the storage layer.

The storage layer is made of a magnetic material such as a ferromagnetic layer, and holds therein the information based on a magnetization state (a direction of magnetization) of the magnetic material.

Figure 2:
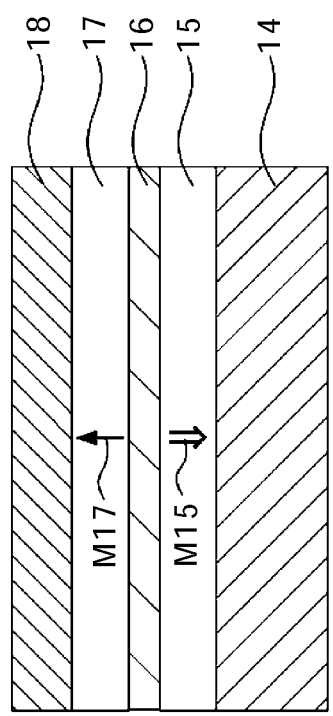
FIG. 2 is a cross sectional view showing a schematic structure of a storage element in the memory device according to the embodiment.

Although details will be described later, the storage element has a layer structure whose example, for example, is shown in FIG. 2, and includes at least a storage layer 17 and a magnetization fixing layer 15 as two magnetic layers. Also, the storage element includes an insulating layer 16 (tunnel insulating layer) as an intermediate layer disposed between the two magnetic layers.

The storage layer 17 has magnetization vertical to a film surface, and a direction of the magnetization thereof is changed in correspondence to the information.

The magnetization fixing layer 15 has magnetization vertical to the film surface becoming as a reference of the information stored in the storage layer 17.

The insulating layer 16 is made of a nonmagnetic material and is provided between the storage layer 17 and the magnetization fixing layer 15.

Also, the direction of the magnetization of the storage layer 17 is changed by injecting spin-polarized electrons in a lamination direction of a lamination structure having the storage layer 17, the insulating layer 16 and the magnetization fixing layer 15, thereby recording the information in the storage layer 17.

A basic operation for reversing the direction of the magnetization of the magnetic layer (the storage layer 17) by the spin injection is such that a current equal to or larger than a certain threshold value is caused to flow in a direction vertical to a film surface of the storage element composed of either a giant magnetoresistance effect (GMR element) or a tunnel magnetoresistance effect element (MTJ element). At this time, a polarity (direction) of the current depends on the direction of the magnetization to be reversed.

When a current whose absolute value is smaller than the threshold value is caused to flow through the storage layer, no magnetization reversal is generated.

The threshold value Ic for the current necessary when the direction of the magnetization of the magnetic layer is reversed by the spin injection is expressed by Expression (1):

$$Ic = A \cdot \alpha \cdot Ms \cdot V \cdot Hd / 2\eta \qquad (1)$$

where A is a constant, α is a spin braking constant, η is a spin injection efficiency, Ms is an amount of saturation magnetization, V is a volume of the storage layer, and Hd is an effective diamagnetic field.

As expressed by Expression (1), the threshold value for the current can be arbitrarily set by controlling the volume, V, of the magnetic layer, and the amount Ms of saturation magnetization of the magnetic layer, the spin injection efficiency, η, and the spin braking constant, α.

In the storage element in this case, the storage element is structured which has the magnetic layer (the storage layer 17) capable of holding therein the information based on the magnetization state, and the magnetization fixing layer 15 the direction of whose magnetization is fixed.

In order that the storage element may exist as a memory, it is necessary for the storage element to be capable of holding therein the written information. With regard to an index of an ability to hold the information, the judgment is made based on a value of an index $\Delta (=KV/k_B T)$ of the thermal stability. The index Δ of the thermal stability is expressed by Expression (2):

$$\Delta = KV/k_B T = Ms \cdot V \cdot H_K \cdot (1/2 K_B T) \qquad (2)$$

where Hk is an effective anisotropy magnetic field, $k_B$ is a Boltzmann constant, T is a temperature, Ms is an amount of saturation magnetization, and V is a volume of the storage layer.

Influences of shape magnetic anisotropy, induced magnetic anisotropy, crystal magnetic anisotropy, and the like are brought in the effective anisotropy magnetic field Hk. Thus, the effective anisotropy magnetic field Hk is equal to the coercive force when a coherent rotation model of a single domain is assumed.

The index Δ of the thermal stability, and the threshold value Ic for the current show a trade-off relationship in many cases. For this reason, for maintaining the memory characteristics, the compatibility between the index Δ of the thermal stability, and the threshold value Ic for the current becomes a problem in many cases.

With regard to the threshold value for the current at which the magnetization of the storage layer 17 is changed, actually, for example, in a TMR (Tunnel Magnetoresistance) element having approximately an elliptical shape in which a thickness of the storage layer 17 is 2 nm, and a size of a planar pattern is 100 nm×150 nm, a threshold value +Ic on a plus side is +0.5 mA, and a threshold value −Ic on a minus side is −0.3 mA.

Also, a current density in this case is about $3.5 \times 10^6$ A/cm$^2$. Each of these values approximately agrees with the value obtained from Expression (1) described above.

On the other hand, the write current of several milliamperes or more is necessary for the normal MRAM in which the magnetization reversal is carried out by the current magnetic field.

Therefore, it is understood that when the magnetization reversal is carried out by the spin injection, the threshold value for the write current becomes sufficiently small as described above, which is effective in reducing the power consumption of the integrated circuit.

Figure 8:
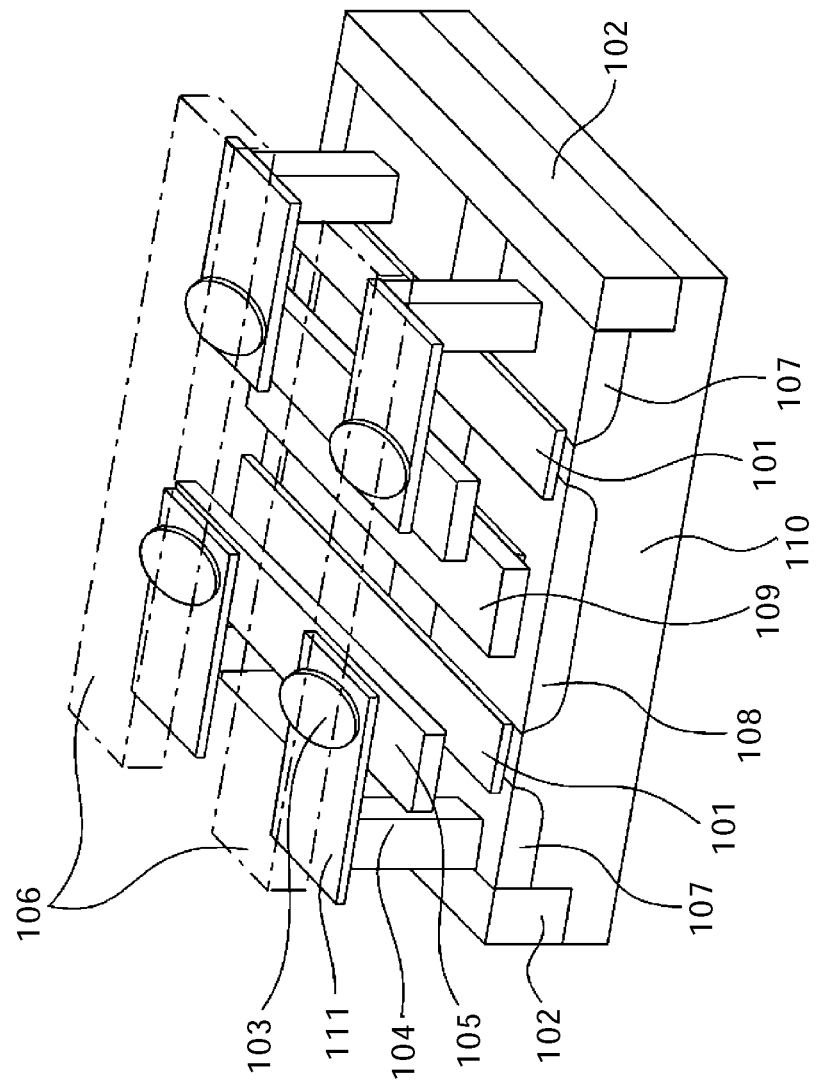
FIG. 8 is a perspective view schematically showing a structure of an existing MRAM.
Figure 9:
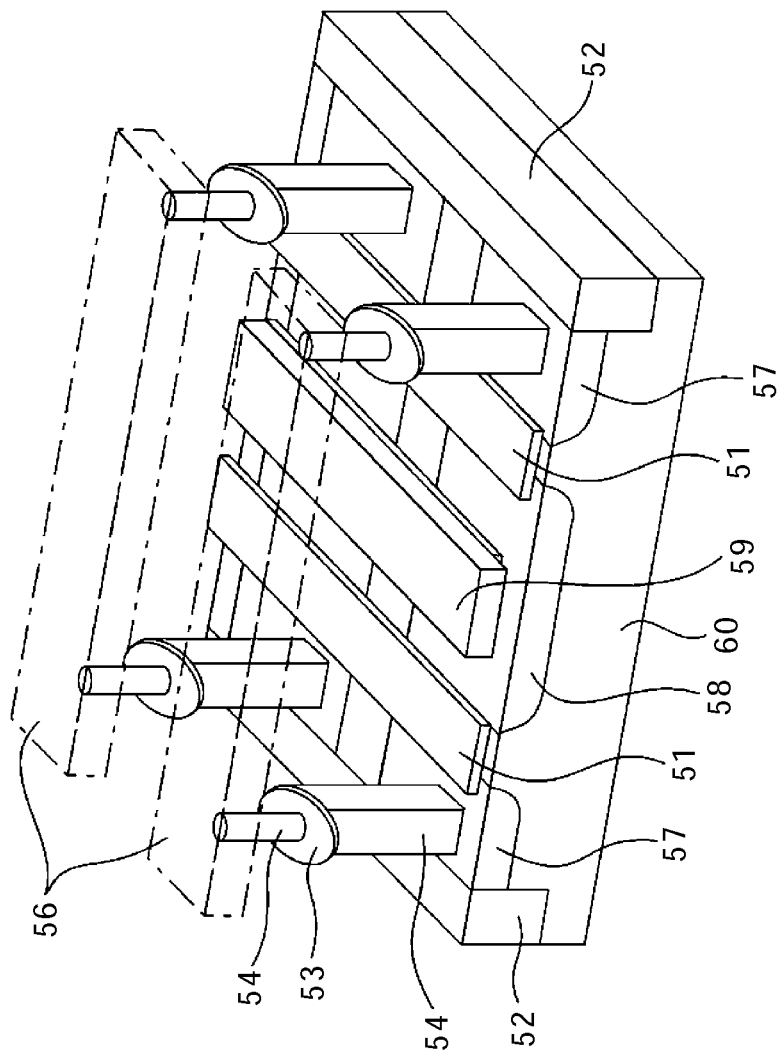
FIG. 9 is an explanatory perspective view showing a schematic structure of a memory device utilizing magnetization reversal by spin injection.

In addition, the wiring (the wiring 105 shown in FIG. 8) for generation of the current magnetic field which is necessary for the normal MRAM becomes unnecessary, which is advantageous in integration level as well as compared with the case of the normal MRAM.

Also, when the magnetization reversal is carried out by the spin injection, the current is caused to directly flow through the storage element, thereby writing (recording) the information to(in) the storage element. Thus, for selecting a memory cell to which the information is to be written, the storage element is connected to a selecting transistor, thereby configuring the memory cell concerned.

In this case, the magnitude of the current caused to flow through the storage element is limited by a magnitude of a current (a saturation current of the selecting transistor) which can be caused to flow through the selecting transistor.

It is understood from Expression (1) that for making the threshold value Ic for the current for the magnetization reversal by the spin injection smaller than the saturation current of the selecting transistor, the amount Ms of saturation magnetization of the storage layer 17 is reduced.

However, when the amount Ms of saturation magnetization is simply reduced (for example, as described in Patent Document 1), the thermal stability of the storage layer 17 is remarkably impaired, and thus it may be impossible to serve as the memory.

For a structure of the memory, it is necessary for the index Δ of the thermal stability to have a certain level or more of magnitude.

Then, the inventors of this application carried out the various kinds of examinations, and as a result found out a composition of the ferromagnetic layer composing the storage layer 17, for example, Co—Fe—B is selected, whereby a magnitude Meffective of the effective diamagnetic field which the storage layer 17 receives becomes smaller than the amount Ms of saturation magnetization of the storage layer 17.

Use of the ferromagnetic material described above results in a structure that the magnitude Meffective of the effective diamagnetic field which the storage layer 17 receives becomes smaller than the amount Ms of saturation magnetization of the storage layer 17.

As a result, since the diamagnetic field which the storage layer 17 receives can be made small, it is possible to obtain an effect that the threshold value Ic for the current expressed by Expression (1) is reduced without impairing the index Δ of the thermal stability expressed by Expression (2).

In addition, the inventors found out that Co—Fe—B is magnetized in a direction vertical to the film surface in a limited composition range of the composition of Co—Fe—B selected in the manner as described above, whereby the sufficient thermal stability can be ensured even in a very micro-storage element in which a capacity of Gbit class can be realized.

Therefore, it is possible to form a stable memory that information can be written with a small current in a state in which the thermal stability is maintained in the spin injection type memory of Gbit class.

In the storage element in this case, the structure that the magnitude Meffective of the effective diamagnetic field which the storage layer 17 receives becomes smaller than the amount Ms of saturation magnetization of the storage layer 17, that is, a value of a ratio of the magnitude of the effective diamagnetic field to the amount Ms of saturation magnetization of the storage layer 17 is made smaller than 1.

In addition, the magnetic tunnel junction (MTJ) element is structured by using the tunnel insulating layer (the insulating layer 16) made of the insulator as the nonmagnetic intermediate layer disposed between the storage layer 17 and the magnetization fixing layer 15 in consideration of the saturation current value of the selecting transistor.

The magnetic tunnel junction (MTJ) element is structured by using the tunnel insulating layer, whereby the magnetoresistance change rate (MR rate) can be made large and the strength of the read-out signal can be made large as compared with the case where the giant magnetoresistance effect (GMR) element is structured by using the nonmagnetic conductive layer.

Also, in particular, a magnesium oxide (MgO) is used as the material of the tunnel insulating layer 16, whereby the magnetoresistance change rate (MR rate) can be made large as compared with the case of use of an aluminum oxide which has been generally used until now.

In addition, in general, the spin injection efficiency depends on the MR rate. Thus, as the MR rate is larger, the spin injection efficiency is enhanced, and thus the magnetization reversal current density can be reduced.

Therefore, the magnesium oxide is used as the material of the tunnel insulating layer 16 as the intermediate layer, and at the same time, the storage layer 17 described above is used, thereby making it possible to reduce the threshold value current for the writing operation by the spin injection. Thus, the information can be written (recorded) to(in) the storage layer with the less current. Also, the strength of the read-out signal can be made large.

As a result, the MR rate (TMR rate) is ensured and thus the threshold value current for the writing operation by the spin injection can be reduced. Thus, the information can be written (recorded) to(in) the storage layer with the less current. Also, the strength of the read-out signal can be made large.

When the tunnel insulating layer 16 is formed from the magnesium oxide (MgO) film in such a way, it is preferable that the MgO film is crystallized and thus maintains the crystalline orientation in (001) direction.

It is noted that in the storage element in this case, in addition to the structure that the intermediate layer (tunnel insulating layer 16) disposed between the storage layer 17 and the magnetization fixing layer 15 is made of the magnesium oxide, a structure can also be adopted such that that intermediate layer is made of any of various insulators such as an aluminum oxide, an aluminum nitride, SiO$_2$, Bi$_2$O$_3$, MgF$_2$, CaF, SrTiO$_2$, AlLaO$_3$, and Al—N—O, a dielectric material, and a semiconductor.

An areal resistance value of the tunnel insulating layer 16 needs to be controlled to about several tens Ωμm$^2$ or less from a viewpoint of obtaining the current density necessary to reverse the direction of the magnetization of the storage layer 17 by the spin injection.

Also, in order to set the areal resistance value in the range described above, in the tunnel insulating layer 16 made from the MgO film, a thickness of the MgO film needs to be set to 1.5 nm or less.

In addition, preferably, the storage element is made small so that the direction of the magnetization of the storage layer 17 can be readily reversed with the small current.

Therefore, preferably, an area of the storage element is set equal to or smaller than 0.01 μm².

It is noted that for the formation of the storage layer 17 in this case, it is also possible to directly laminate other ferromagnetic layers having different compositions one upon another. In addition, it is also possible to laminate a ferromagnetic layer and a soft magnetic layer on top of each other, or to laminate plural ferromagnetic layers one upon another through either a soft magnetic layer(s) or a nonmagnetic layer(s). Even when the lamination is carried out in such a way, the effects inherent in the present application are obtained.

In particular, when the structure is adopted such that plural ferromagnetic layers are laminated one upon another through the nonmagnetic layer(s), it becomes possible to adjust a strength of an interaction between the ferromagnetic layers. Thus, there is obtained an effect such that even when the size of the storage element becomes equal to or smaller than a submicron size, the magnetization reversal current can be suppressed so as not to become large. Ru, Os, Re, Ir, Au, Ag, Cu, Al, Bi, Si, B, C, Cr, Ta, Pd, Pt, Zr, Hf, W, Mo, Nb or an alloy thereof can be used as the material of the nonmagnetic layer in this case.

Preferably, each of the magnetization fixing layer 15 and the storage layer 17 has unidirectional anisotropy.

In addition, each of the thicknesses of the magnetization fixing layer 15 and the storage layer 17 is in the range of 0.5 to 30 nm.

Other structures of the storage element can be made identical to the previously known structures of the storage element for recording therein information by the spin injection.

The magnetization fixing layer 15 can adopt a structure that the direction of the magnetization is fixed either by only the ferromagnetic layer, or by utilizing the diamagnetic field coupling between the antiferromagnetic layer and the ferromagnetic layer. The storage element in this case corresponds to the case where the magnetization fixing layer 15 has the multilayered ferri-pin structure.

In addition, the magnetization fixing layer 15 can adopt either a structure composed of a single ferromagnetic layer, or the multilayered ferri-pin structure that plural ferromagnetic layers are laminated through the nonmagnetic layer(s). In this case, the ferromagnetic layers are magnetically coupled to one another in an antiparallel manner through the nonmagnetic layer(s).

Co, Co—Pt, Co—Fe—Pt, Co—Fe, Co—Fe—B or the like can be used as the material of the ferromagnetic layer composing to the magnetization fixing layer 15 having the multilayered ferri-pin structure. In addition, Ru, Re, Ir, Os or the like can be used as the material of the nonmagnetic layer.

A magnetic material such as an FeMn alloy, a PtMn alloy, a PtCrMn alloy, a NiMn alloy, or an IrMn alloy, NiO or $Fe_2O_3$ can be given as the material of the antiferromagnetic layer.

In addition, an nonmagnetic element such as Ag, Cu, Au, Al, Si, Bi, Ta, B, C, O, N, Pd, Pt, Zr, Hf, Ir, W, Mo, or Nb is added to such a magnetic material, thereby making it possible to adjust the magnetic characteristics, or to adjust various other physical properties such as a crystalline structure, crystallinity, and stability of a material.

In addition, there is no problem at all even in the structure that the storage layer 17 is disposed on the lower side of the magnetization fixing layer 15, or even in the structure that the storage layer 17 is disposed on the upper side of the magnetization fixing layer 15. Moreover, there is no problem at all even in a so-called dual structure that the magnetization fixing layers 15 exist on the upper and lower sides of the storage layer 17, respectively.

It is noted that with regard to a method of reading out the information recorded in the storage layer 17 of the storage element, in a state in which the magnetic layer becoming the reference of the information is provided on the storage layer 17 of the storage element through a thin insulating film, the information may be read out by a ferromagnetic tunnel current caused to flow through the insulating layer 16, or may be read out by a magnetoresistance effect.

2. Memory Device (Embodiment)

Subsequently, a concrete structure of the memory device according to an embodiment will be described in detail.

Figure 1:
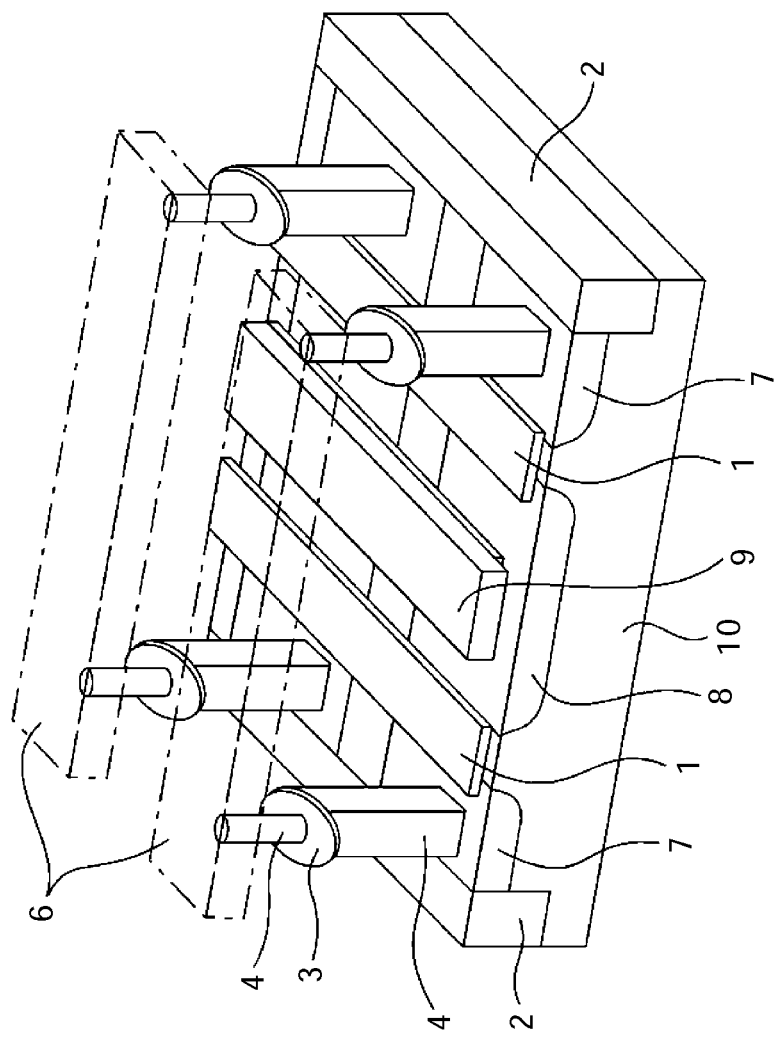
FIG. 1 is an explanatory perspective view showing a schematic structure of a memory device according to an embodiment.

FIG. 1 is a structural view (perspective view) showing a schematic structure of the memory device according to the embodiment.

This memory device is structured in such a way that the storage element 3 which can hold therein information in the magnetization state is disposed in the vicinity of an intersection point between two kinds of address wirings (such as the word line and the bit line) bisecting at right angles with each other.

That is to say, a drain region 8, a source region 7, and a gate electrode 1 composing a selecting transistor for selecting corresponding one of memory cells are formed in a portion, of a semiconductor substrate 10 such as a silicon substrate, isolated from other portions by an isolating region 2. Of these constituent elements, the gate electrode 1 serves as one address wiring as well (such as the word line) extending in a front-back direction in FIG. 1.

The drain region 8 is formed which the right-hand and left-hand side selecting transistors in FIG. 1 hold in common. Also, a wiring 9 is connected to the drain region 8.

Also, the storage element 3 is disposed between the source region 7, and the other address wiring (such as the bit line) 6 disposed above the source region 7 and extending in a horizontal direction in FIG. 1. The storage element 3 has the storage layer composed of the ferromagnetic layer the direction of whose magnetization is adapted to be reversed by the spin injection.

In addition, the storage element 3 is disposed in the vicinity of the intersection point between the two kinds of address lines 1 and 6.

The storage element 3 is connected to the bit line 6 and the source region 7 through upper and lower contact layers 4, respectively.

As a result, a current in a vertical direction is caused to flow through the storage element 3 through the two kinds of address wirings 1 and 6, thereby making it possible to reverse the direction of the magnetization of the storage layer by the spin injection.

In addition, FIG. 2 is a cross sectional view of the storage element 3 of the memory device of the embodiment.

As shown in FIG. 2, in the storage element 3, a base layer 14, the magnetization fixing layer 15, the insulating layer 16, the storage layer 17, and a cap layer 18 are laminated in this order from the lower layer side.

In this case, the magnetization fixing layer 15 is provided in a lower layer with respect to the storage layer 17 the direction of whose magnetization M17 is adapted to be reversed by the spin injection.

In the spin injection type memory, the information: "0"; and "1" is regulated by a relative angle between the magnetization M17 of the storage layer 17, and the magnetization M15 of the magnetization fixing layer 15.

The insulating layer 16 becoming the tunnel barrier layer (tunnel insulating layer) is provided between the storage layer 17 and the magnetization fixing layer 15. Also, the MTJ element is composed of the storage layer 17 and the magnetization fixing layer 15.

In addition, the base layer 14 is formed so as to underlie the magnetization fixing layer 15, and the cap layer 18 is formed so as to overlie the storage layer 17.

The storage layer 17 is made of a ferromagnetic material having a magnetic moment with which the direction of the magnetization M17 is freely changed in a direction vertical to the layer surface. The magnetization fixing layer 15 is made of a ferromagnetic material having a magnetic moment with which the magnetization M15 is fixed to the direction vertical to the layer surface.

The storage of the information is carried out based on the direction of the magnetization of the storage layer 17 having uniaxial anisotropy. A current is caused to flow in the direction vertical to the layer surface to cause the spin torque magnetization reversal, thereby writing the information in the storage layer 17. The magnetization fixing layer 15 is provided in the lower layer with respect to the storage layer 17 the direction of whose magnetization is adapted to be reversed by the spin injection in such a way, and is used as the reference for the stored information (magnetization direction) of the storage layer 17.

In the embodiment, each of the storage layer 17 and the magnetization fixing layer 15 is made of Co—Fe—B.

Since the magnetization fixing layer 15 is used as the reference of the information, the direction of the magnetization thereof should not be changed by the recording or the reading. However, the direction of the magnetization needs not to be necessarily fixed to a specific direction. Thus, it is only necessary that the magnetization fixing layer 15 is made larger in coercive force, in a thickness, or in a magnetic dumping constant than in the storage layer 17, thereby causing the magnetization fixing layer 15 to be harder to move than the storage layer 17.

When the magnetization is fixed, the antiferromagnetic material such as PtMn or IrMn may be brought in contact with the magnetization fixing layer 15, or the magnetic materials contacting these antiferromagnetic materials may be magnetically coupled to each other through the nonmagnetic material such as Ru, thereby indirectly fixing the magnetization fixing layer 15.

It is noted that the embodiment corresponding to the case of the multilayered ferri-pin structure that the magnetization fixing layer 15 is structured in such a way that plural ferromagnetic layers are laminated one upon another through the nonmagnetic layer(s). In this case, the ferromagnetic layers are magnetically coupled to one another in the antiparallel manner through the nonmagnetic layer(s).

The feature of the embodiment is that especially, the composition of the storage layer 17 of the storage element 3 is adjusted so that the magnitude of the effective diamagnetic field which the storage layer 17 receives becomes smaller than the amount Ms of saturation magnetization of the storage layer 17.

That is to say, as described above, the composition of Co—Fe—B as the ferromagnetic material of the storage layer 17 is selected in such a way that the magnitude of the effective diamagnetic field which the storage layer 17 receives is reduced so as to become smaller than the amount Ms of saturation magnetization of the storage layer 17.

In addition, in the embodiment, when the insulating layer 16 as the intermediate layer is composed of the magnesium oxide layer, it is possible to increase the magnetoresistance rate (MR rate).

The MR rate is increased in such a way to enhance the efficiency of the spin injection, thereby making it possible to reduce the current density necessary to reverse the direction of the magnetization M17 of the storage layer 17.

The storage element 3 of the memory device of the embodiment can be manufactured in such a way that the constituent elements from the base layer 14 to the cap layer 18 are continuously formed within a vacuum system, and a pattern of the storage element 3 is then formed through processing such as etching.

According to the memory device of the embodiment, the storage layer 17 of the storage element 3 is structured in such a way that the magnitude of the effective diamagnetic field which the storage layer 17 receives becomes smaller than the amount Ms of saturation magnetization of the storage layer 17. Therefore, the diamagnetic field which the storage layer 17 receives is reduced, and thus it is possible to reduce an amount of write current necessary to reverse the direction of the magnetization M17 of the storage layer 17.

On the other hand, even when the amount Ms of saturation magnetization of the storage layer 17 is not reduced, it is possible to reduce the amount of write current. Therefore, the thermal stability of the storage layer 17 can be sufficiently ensured with the amount Ms of saturation magnetization of the storage layer 17 as a sufficient amount. In addition, the magnetization fixing layer has the multilayered ferri-pin structure. Therefore, the magnetization fixing layer is made to get dull against the external magnetic field, and the leakage magnetic field due to the fixing layer is cut off. Also, it is possible to strengthen the perpendicular magnetic anisotropy of the magnetization fixing layer due to the interlayer coupling among plural magnetic layers.

Since the thermal stability as the information holding ability can be sufficiently ensured in such a way, it is possible to structure the storage element 3 which is excellent in characteristics balance.

As a result, the operation error can be removed and thus the operation margin of the storage element 3 can be sufficiently obtained. As a result, the storage element 3 can be stably operated.

Accordingly, it is possible to realize the highly reliable memory device which stably operates.

In addition, the write current can be reduced, thereby making it possible to reduce the power consumption when the information is written to the storage element 3.

Accordingly, it becomes possible to reduce the power consumption of the entire memory device in which the memory cell is structured as the storage element 3 in the embodiment.

Accordingly, it is possible to realize the highly reliable memory device which is excellent in information holding characteristics and which stably operates. Also, it is possible to reduce the power consumption in the memory device including the storage element 3.

In addition, the memory device having the structure shown in FIG. 1 and including the storage element 3 shown in FIG. 2 has an advantage that when the memory device is manufactured, the general semiconductor MOS (Metal Oxide Semiconductor) forming process can be applied.

Accordingly, the memory device of the embodiment can be applied as a general-purpose memory.

3. Experiments

Here, in the structure of the storage element in the memory device of the embodiment, the material of the ferromagnetic layer composing the storage layer 17 was concretely selected, thereby adjusting the magnitude of the effective diamagnetic field which the storage layer received. Under this condition, specimens of the storage element were manufactured, and the characteristics of these specimens were checked.

As shown in FIG. 1, in addition to the storage element 3, a switching semiconductor circuit and the like exist in the actual memory device. Here, however, for the purpose of checking the magnetization reversal characteristics of the storage layer 17, the study was carried out for a wafer in which only the storage elements were formed.

Experiment 1

A thermally-oxidized film having a thickness of 300 nm was formed on a silicon substrate having a thickness of 0.725 mm, and the storage element 3 having the structure shown in FIG. 2 was formed on the thermally-oxidized film.

Specifically, in the storage element 3 having the structure shown in FIG. 2, materials and thicknesses thereof of the layers were selected as follows:

(1) The base layer 14: a multilayered film of a Ta film having a thickness of 10 nm, and a Ru film having a thickness of 25 nm;

(2) The magnetization fixing layer 15: a CoFeB film having a thickness of 2.5 nm;

(3) The tunnel insulating layer 16: a magnesium oxide film having a thickness of 0.9 nm;

(4) The storage layer 17: a CoFeB film having the same composition as that of the magnetization fixing layer 16; and (5) The cap layer 18: a multilayered film of a Ta film having a thickness of 3 nm, a Ru film having a thickness of 3 nm, and a Ta film having a thickness of 3 nm.

The materials and thicknesses of the layers were selected in such a way. Also, a Cu film having a thickness of 10 nm (becoming the word line which will be described later) (not shown) was provided between the base layer 14 and the silicon substrate.

In the film structures described above, the ferromagnetic layer of the storage layer 17 was made of a ternary alloy: Co—Fe—B, and the thickness of the ferromagnetic layer was fixed to 2.0 nm.

Each of the layers other than the insulating layer 16 made from the magnesium oxide (MgO) film was deposited by using a DC magnetron sputtering method.

The insulating layer 16 made from the magnesium oxide (MgO) film was deposited by using an RF magnetron sputtering method.

In addition, after the layers of the storage elements 3 were deposited, a heat treatment was carried out within a heat-treating furnace in a magnetic field.

Next, after the word line portion was masked by utilizing photolithography, selective etching was carried out for a laminated film of a portion other than the word line by using Ar plasma, thereby forming the word line (the lower electrode).

In this case, the portion other than the word line was etched to a depth of 5 nm of the substrate.

After that, a mask for a pattern of the storage element 3 was formed by using an electron beam lithography system, and the selective etching was carried out for the laminated film, thereby forming the storage element 3. A portion other than the storage element 3 was etched to a depth right above the Cu layer composing the word line.

It is noted that since the sufficient current needs to be caused to flow through the storage element for evaluation of the characteristics in order to generate a spin torque necessary for the magnetization reversal, it is necessary to suppress the resistance value of the tunnel insulating layer. Then, an elliptical shape having a size of 0.09 μm in short axis×0.18 μm in long axis was used as the pattern of the storage element 3 so that the areal resistance value (Ωμm$^2$) become 20 Ωμm$^2$.

Next, the portion other than the storage element 3 was insulated by an Al$_2$O$_3$ film having a thickness of about 100 nm in the sputtering process.

After that, the bit line becoming the upper electrode, and pads for measurement were formed by using the photolithography.

In such a way, the specimen of the storage element 3 was manufactured.

Also, the specimens of the storage element 3 in which the composition of the Co—Fe—B ternary alloy of the ferromagnetic layer as the storage layer 17 was changed were manufactured by utilizing the manufacturing method described above.

With regard to the composition of the Co—Fe—B ternary alloy, a composition ratio (at %) of B to CoFe was fixed to 80:20. Under this condition, the composition ratio x (at %) of Co in CoFe was changed to 90%, 80%, 70%, 60%, 50%, 40%, 30%, 20%, 10%, and 0% in order.

The evaluation of the characteristics was carried out for the specimens of the storage element 3 which had been manufactured so far in the following manner.

Prior to the measurements, for the purpose of enabling a value in a plus direction and a value in a minus direction of an inversion current to be controlled so as to be symmetrical, a structure was adopted such that the magnetic field can be applied from the outside to the storage element 3.

In addition, the voltage applied to the storage element 3 was set so as to become up to 1 V within the range in which the insulating layer 16 was not broken down.

(Measurement about Amount of Saturation Magnetization)

The amount Ms of saturation magnetization was measured by a Vibrating Sample Magnetometer (VSM) measurement using a VSM.

(Measurement about Effective Diamagnetic Field)

A specimen in which the layers 14 to 18 composing the storage element 3 were formed into a planar pattern 20 mm squares was manufactured as a specimen for measurement of the effective diamagnetic field separately from the specimens of the storage element 3 described above.

Also, the magnitude Meffective of the effective diamagnetic field was obtained from a Ferromagnetic Resonance (FMR) measurement.

A sympathetic resonance frequency, fMR, for an arbitrary external magnetic field, Hex, obtained from the FMR measurement is given by Expression (3):

$$f_{FMR} = \gamma' \sqrt{4\pi M\text{effective}(H_K + H_{ex})} \quad (3)$$

where Meffective can be expressed by 4 πMeffective=4 πMs−H⊥ (H⊥: an anisotropy magnetic field in a direction vertical to a film surface).

(Measurements about Inversion Current Value and Thermal Stability)

For the purpose of evaluating the write characteristics of the storage element 3 in the embodiment, a measurement about the inversion current value was carried out.

A current having a pulse width of 10 μs to 100 ms was caused to flow through the storage element 3, and the subsequent resistance value of the storage element 3 was measured.

In addition, while the value of the current caused to flow through the storage element 3 was changed, the current value was obtained at which the direction of the magnetization M17 of the storage layer 17 of the storage element 3 was reversed. Also, a value obtained by extrapolating the pulse width dependency of the current value thus obtained into the pulse width of 1 ns was used as the inversion current value.

In addition, a gradient of the pulse width dependency of the inversion current value corresponds to the above index $\Delta$ of the thermal stability of the storage element 3. When the inversion current value is not further changed by the pulse width (as the gradient is smaller), this means that the storage element 3 is strong against the thermal disturbance.

Also, for the purpose of taking the dispersion among the storage elements 3 into consideration, about 20 storage elements 3 having the same structure were manufactured, and the measurements described above were carried out, thereby obtaining average values of the inversion current values, and the indices $\Delta$ of the thermal stabilities.

In addition, an inversion current density Jc0 was calculated from both the average value of the inversion current values obtained from the measurement, and an area of the planar pattern of the storage element 3.

Table 1 shows the composition of the Co—Fe—B ternary alloy of the storage layer 17, the measurement results of the amount Ms of saturation magnetization and the magnitude Meffective of the effective diamagnetic field, and a ratio Meffective/Ms of the amount Ms of saturation magnetization to the magnitude Meffective of the effective diamagnetic field. Here, a Co amount of Co—Fe—B ternary alloy of the storage layer 17 described in Table 1 is expressed in a unit of at %.

TABLE 1

| | Ms (emu/cc) | Meffctive (emu/cc) | Meffective/Ms |
|---|---|---|---|
| $(Co_{90}Fe_{10})_{80}$—$B_{20}$ | 960 | 1210 | 1.26 |
| $(Co_{80}Fe_{20})_{80}$—$B_{20}$ | 960 | 1010 | 1.05 |
| $(Co_{70}Fe_{30})_{80}$—$B_{20}$ | 1040 | 900 | 0.87 |
| $(Co_{60}Fe_{40})_{80}$—$B_{20}$ | 1200 | 830 | 0.69 |
| $(Co_{50}Fe_{50})_{80}$—$B_{20}$ | 1300 | 690 | 0.53 |
| $(Co_{40}Fe_{60})_{80}$—$B_{20}$ | 1300 | 500 | 0.38 |
| $(Co_{30}Fe_{70})_{80}$—$B_{20}$ | 1260 | 390 | 0.31 |
| $(Co_{20}Fe_{80})_{80}$—$B_{20}$ | 1230 | 360 | 0.29 |
| $(Co_{10}Fe_{90})_{80}$—$B_{20}$ | 1200 | 345 | 0.29 |
| $Fe_{80}$—$B_{20}$ | 1160 | 325 | 0.28 |

From Table 1, when the Co amount x of $(Co_xFe_{100-x})_{80}B_{20}$ is equal to or smaller than 70%, the magnitude Meffective of the effective diamagnetic field is smaller than the amount Ms of saturation magnetization, in a word, the ratio Meffective/Ms when the Co amount x is equal to or smaller than 70 at % is smaller than 1.0.

In addition, it can be confirmed that as the Co amount x becomes smaller, a difference between the magnitude Meffective of the effective diamagnetic field and the amount Ms of saturation magnetization becomes large.

Figure 3:
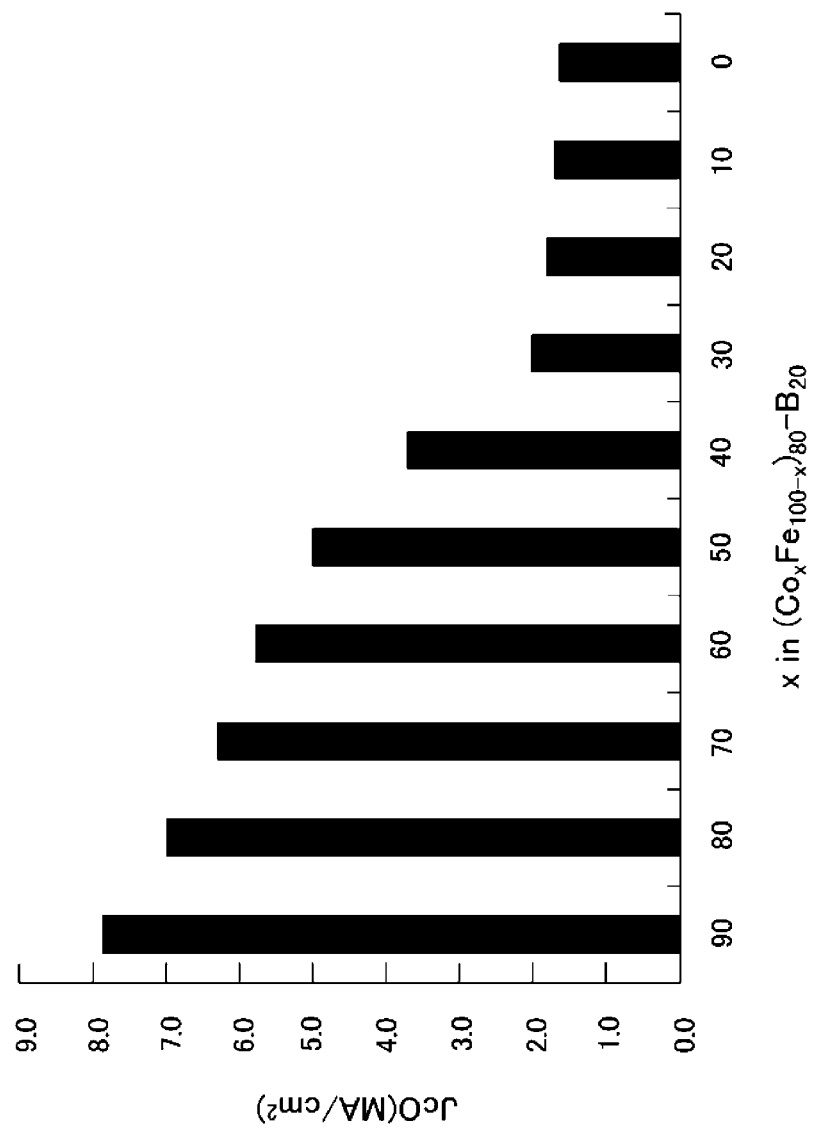
FIG. 3 is a graphical representation showing a relationship between an amount of Co of a storage layer having a size of 0.09 μm×0.18 μm (storage element), and an inversion current density.
Figure 4:
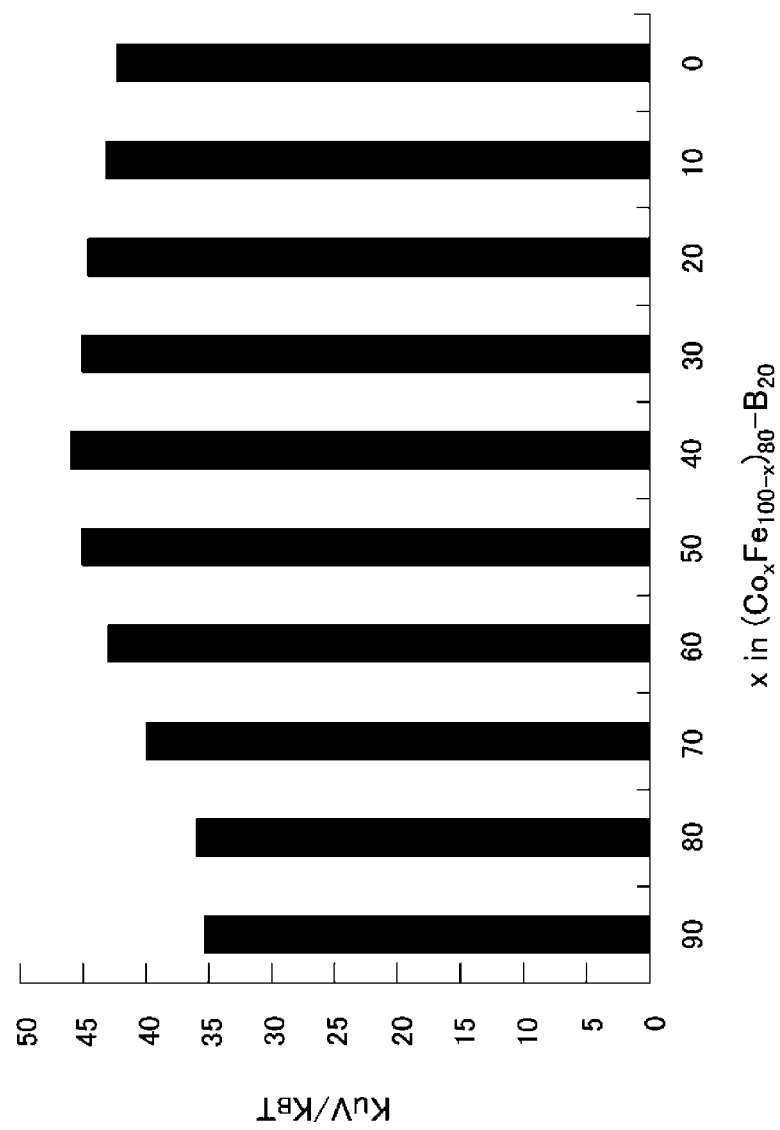
FIG. 4 is a graphical representation showing a relationship between an amount of Co of the storage layer having a size of 0.09 μm×0.18 μm (storage element), and an index of thermal stability.

FIG. 3 shows the measurement results of the inversion current value, and FIG. 4 shows the measurement results of the index of the thermal stability.

FIG. 3 shows a relationship between the Co amount x (content in CoFe; at %) of the Co—Fe—B ternary alloy of the storage layer 17 and the inversion current density Jc0 obtained from the inversion current value.

Also, FIG. 4 shows a relationship between the Co amount x (content in CoFe; at %) of the Co—Fe—B ternary alloy of the storage layer 17 and the index $\Delta(=KV/k_BT)$ of the thermal stability.

It is understood from FIG. 3 that as the Co amount x becomes smaller, the inversion current density Jc0 becomes small.

This situation results from that since when the Co amount x is reduced, the magnitude Meffective of the effective diamagnetic field is reduced although the amount Ms of saturation magnetization is increased, the product (Ms×Meffective) of the amount Ms of saturation magnetization and the magnitude Meffective of the effective diamagnetic field becomes small.

It is understood from the measurement result shown in FIG. 4 that as the Co amount x becomes smaller, the index $\Delta(=KV/k_BT)$ of the thermal stability becomes large, and when the Co amount x is reduced below a certain level, the index $\Delta$ of the thermal stability is stabilized at a large value.

This situation agrees well with a change anticipated from the measurement result of the amount Ms of saturation magnetization shown in FIG. 4, and the fact that the index $\Delta$ of the thermal stability is proportional to the amount Ms of saturation magnetization as apparent from Expression (2).

It was made clear from the values of Table 1, and FIGS. 3 and 4 that in the composition of 70% or less in the Co amount x in which the magnitude Meffective of the effective diamagnetic field is smaller than the amount Ms of saturation magnetization, the inversion current value Jc0 can be reduced while the high thermal stability is held without using such a technique as to reduce the amount Ms of saturation magnetization at the sacrifice of the thermal stability.

Experiment 2

It was found out from Experiment 1 described above that in the case of $(Co_xFe_{100-x})_{80}B_{20}$, the inversion current value Jc0 can be reduced while the high thermal stability is held in the composition of 70% or more in the Co amount x.

Then, what kind of influences a B amount z exerted on the ratio of Co to Fe, and the ratio Meffective/Ms was studied by using the storage layers 17 having the compositions of $(Co_{70}Fe_3O)_{80}B_z$, and $(Co_{80}Fe_2O)_{80}B_z$, respectively. The details of the specimens are identical to those in the case of Example 1.

Table 2 shows the composition of the Co—Fe—B ternary alloy in which the B amount z (at %) was set in the range of 5 to 40% in the case of $(Co_{70}Fe_{30})_{100-z}B_z$, the measurement results of the amount Ms of saturation magnetization and the magnitude Meffective of the effective diamagnetic field, and the ratio Meffective/Ms of the amount Ms of saturation magnetization to the magnitude Meffective of the effective diamagnetic field.

In addition, Table 3 shows the composition of the Co—Fe—B ternary alloy in which the B amount z (at %) was similarly set in the range of 5 to 40% in the case of $(Co_{80}Fe_{20})_{100-z}B_z$, the measurement results of the amount Ms of saturation magnetization and the magnitude Meffective of the effective diamagnetic field, and the ratio Meffective/Ms of the amount Ms of saturation magnetization to the magnitude Meffective of the effective diamagnetic field.

TABLE 2

| | Ms (emu/cc) | Meffective (emu/cc) | Meffective/Ms |
|---|---|---|---|
| $(Co_{70}Fe_{30})_{95}$—$B_5$ | 1310 | 1090 | 0.83 |
| $(Co_{70}Fe_{30})_{90}$—$B_{10}$ | 1250 | 1080 | 0.89 |
| $(Co_{70}Fe_{30})_{80}$—$B_{20}$ | 1040 | 900 | 0.87 |
| $(Co_{70}Fe_{30})_{70}$—$B_{30}$ | 820 | 730 | 0.89 |
| $(Co_{70}Fe_{30})_{60}$—$B_{40}$ | 450 | 690 | 1.53 |

TABLE 3

|  | Ms (emu/cc) | Meffective (emu/cc) | Meffective/Ms |
|---|---|---|---|
| $(Co_{80}Fe_{20})_{95}$—$B_5$ | 1250 | 1280 | 1.02 |
| $(Co_{80}Fe_{20})_{90}$—$B_{10}$ | 1100 | 1140 | 1.04 |
| $(Co_{80}Fe_{20})_{80}$—$B_{20}$ | 960 | 1010 | 1.05 |
| $(Co_{80}Fe_{20})_{70}$—$B_{30}$ | 750 | 890 | 1.19 |
| $(Co_{80}Fe_{20})_{60}$—$B_{40}$ | 430 | 690 | 1.60 |

It can be confirmed from the results shown in Table 2 that when like $(Co_{70}Fe_{30})_{100-z}B_z$, the ratio of Co to Fe is fixed to 70/30, in any of the compositions other than the composition of the B amount z=40 at %, the amount Ms of saturation magnetization is smaller than the magnitude Meffective of the effective diamagnetic field.

It can be confirmed from the results shown in Table 3 that when like $(Co_{80}Fe_{20})_{100-z}B_z$, the ratio of Co to Fe is fixed to 80/20, in any of the compositions, the amount Ms of saturation magnetization is larger than the magnitude Meffective of the effective diamagnetic field.

It was made clear from the results shown in Tables 1 to 3 described above, a magnitude relationship between the amount Ms of saturation magnetization, and the magnitude Meffective of the effective diamagnetic field is determined by the ratio of Co to Fe as long as the B amount z falls within the range of 30 at % or less.

Therefore, the composition of the Co—Fe—B ternary alloy in which the amount Ms of saturation magnetization of the storage layer 17 is smaller than the magnitude Meffective of the effective diamagnetic field is expressed as follows:

$$(Co_xFe_y)100_{-z}B_z$$

where $0 \leq Co_x \leq 70$, $30 \leq Fe_y \leq 100$, and $0 < B_z \leq 30$.

Experiment 3

In the spin injection type memory of Gbit class, it is supposed that the diameter (size) of the recording element becomes equal to or smaller than 100 nm. Then, in Experiment 3, the thermal stability was evaluated for the storage element having a diameter of 50 nm.

With regard to the composition of the Co—Fe—B ternary alloy, the composition ratio (at %) of B to CoFe was fixed to 80:20. Under this condition, the composition ratio x (at %) of Co in CoFe was changed to 90%, 80%, 70%, 60%, 50%, 40%, 30%, 20%, 10%, and 0% in order.

Details of the specimen other than the element size are identical to those in the case of Experiment 1.

FIG. 5 shows a relationship between the Co amount x (content in CoFe; at %) of the Co—Fe—B ternary alloy and the index $\Delta(=KV/k_BT)$ of the thermal stability when the diameter (size) of the storage element 3 is 50 nm.

It is understood from FIG. 5 that the diameter of the storage element 3 is set to 50 nm, which results in that the dependency of the index $\Delta$ of the thermal stability on the component of the Co—Fe—B ternary alloy is largely changed from the dependency of the index $\Delta$ of the thermal stability on the component of the Co—Fe—B ternary alloy obtained in the storage element having the elliptical shape of 0.09 μm in short axis×0.18 μm in long axis shown in FIG. 4.

As shown in FIG. 5, only in the case of the composition of the Co—Fe—B ternary alloy containing therein Fe at 60 at % or more, the high thermal stability is held.

As a result of carrying out the various kinds of studies, it became obvious that the reason why the Co—Fe—B ternary alloy containing therein Fe at 60 at % or more show the index $\Delta$ of the high thermal stability in the very micro-storage element results from that the magnetization of the Co—Fe—B ternary alloy is directed to the direction vertical to the film surface.

It seems likely that the reason why the magnetization of the Co—Fe—B ternary alloy is directed to the direction vertical to the film surface results from that the amount Ms of saturation magnetization corresponds to the composition which is remarkably smaller than that in the case of the magnitude Meffective of the effective diamagnetic field.

In addition, the reason why the thermal stability is held even in the very micro-element when the perpendicular magnetic film is obtained is related to "the effective anisotropy magnetic field" Hk in Expression (2). In this case, the effective anisotropy magnetic field Hk of the perpendicular magnetic film generally gets a value much larger than in an in-plane magnetization film. In a word, in the perpendicular magnetic film, owing to the effect of the large Hk, the index $\Delta$ of the high thermal stability can be held even in the very micro-element with which it may be impossible to ensure the index $\Delta$ of the sufficient thermal stability in the case of the in-plane magnetization film.

From the Experiment results described above, it can be said that when the $Fe_{100-x}$ amount becomes equal to or larger than 60 at % in the Co—Fe—B ternary alloy having the composition: $(Co_xFe_{100-x})_{80}B_{20}$, the Co—Fe—B ternary alloy concerned is suitable for the memory device utilizing the spin injection of Gbit class.

Experiment 4

From Experiment 3 described above, it was shown that when the Fe amount becomes equal to or larger than 60 at % in the Co—Fe—B ternary alloy having the composition: $(Co_xFe_{100-x})_{80}B_{20}$, the Co—Fe—B ternary alloy concerned is suitable for the memory device utilizing the spin injection of Gbit class. In Experiment 4, a storage element having a diameter (size) of 50 nm was manufactured so as to be composed, as a specimen, of a Co—Fe—B ternary alloy in which a B amount is in the range of 5 to 30 at %, and the thermal stability was evaluated for the storage element thus manufactured. Details of the specimen are identical to those in the case of Experiment 1.

Table 4 shows a relationship between the Co—Fe—B ternary alloy having the composition: $(Co_xFe_{100-x})_{100-z}B_z$ where the Co amount x=50, 40, 30, 20, 10, and 0, and the B amount z=5, 10, 20, and 30, and the index $\Delta(=KV/k_BT)$ of the thermal stability.

TABLE 4

|  | $(Co_{50}$—$Fe_{50})_{1(1)-z}$—$B_z$ | $(Co_{40}$—$Fe_{60})_{100-z}$—$B_z$ | $(Co_{30}$—$Fe_{70})_{100-z}$—$B_z$ | $(Co_{20}$—$Fe_{80})_{100-z}$—$B_z$ | $(Co_{10}$—$Fe_{90})_{100-z}$—$B_z$ | $Fe_{100-z}$—$B_z$ |
|---|---|---|---|---|---|---|
| $B_z$ = 5 at % | 19 | 40 | 42 | 42 | 43 | 44 |
| $B_z$ = 10 at % | 20 | 41.5 | 43 | 44 | 44 | 45 |
| $B_z$ = 20 at % | 20 | 43 | 44 | 45 | 46 | 46 |
| $B_z$ = 30 at % | 21 | 45 | 47 | 48 | 48 | 48 |

It is understood from Table 4 that the index Δ of the thermal stability is largely held in all of the compositions except for the case where the Co amount x=50 at % and the B amount z=5 to 30 at %.

In a word, it was made clear that similarly to the case of the results in Experiment 4, the Co amount x between 50 at % and 60 at % became a boundary when the high thermal stability is ensured in the very micro-element corresponding to the spin injection type memory of Gbit class.

Therefore, from the results described above, it became clear that when the composition of the Co—Fe—B alloy composing the storage layer 17 is expressed as $(Co_x Fe_y)_{100-z}B_z$ where $0 \leq Co_x \leq 40$, $60 \leq Fe_y \leq 100$, and $0 < B_z 30$, the Co—Fe—B ternary alloy composing the storage layer 17 is suitable for manufacturing the spin injection type memory of Gbit class.

It should be noted that it becomes easy to ensure the thermal stability in the Co—Fe—B ternary alloy because the difference between the magnitude Meffective of the effective diamagnetic field, and the amount Ms of saturation magnetization becomes large in the composition in which Fe in the ratio of Co to Fe is large, and thus the perpendicular magnetization is readily obtained.

For this reason, when the capacity of the magnetic memory is increased and thus the size of the storage element 3 is reduced, the thermal stability becomes easy to ensure in the Co—Fe—B ternary alloy containing therein a lot of Fe than in any other Co—Fe—B ternary alloy.

Then, for example, considering a situation that the spin injection type magnetic memory of Gbit class is realized with the storage layer 17 having the diameter of 70 nm and containing therein the Fe amount y of 60 at %, it is preferably to provide a state in which the Fe amount y of the Co—Fe—B ternary alloy is increased 5 by 5 whenever the diameter of the storage element 3 is reduced by 5 nm.

For example, it becomes a more suitable example in correspondence to the reduction of the size of the storage element 3 that in the case of the composition described above: $(Co_x Fe_y)_{100-z}B_z$, the content of the Fe amount y (at %) in CoFe is made to have the composition of 65%, 70%, 75%, 80%, ... (35%, 30%, 25%, 20%, ... in terms of the Co amount x).

Experiment 5

In Experiment 5, the characteristics when the magnetization fixing layer 15 of the storage element 3 shown in FIG. 2 had the multilayered ferri-pin structure were checked. The measurements about the magnetization curve, the measurements about the magnetoresistance curve, and the measurements about the inversion current value and the thermal stability were carried out. Four kinds of specimens 1 to 4 were prepared as the specimen for these measurements. It is noted that the specimen 4 is the specimen for comparison.

The structures of the magnetization fixing layer 15 of the specimens 1 to 4 are as follows.

(1) Specimen 1: a laminated film of a Co—Pt layer having a thickness of 1.5 nm, a Ru film having a thickness of 0.8 nm, and a $[Co_{20}Fe_{80}]_{80}B_{20}$ film having a thickness of 1.0 nm.

(2) Specimen 2: a laminated film of a $Co_{90}Fe_{10}$—Pt layer having a thickness of 1.5 nm, a Ru film having a thickness of 0.8 nm, and a $[Co_{20}Fe_{80}]_{80}B_{20}$ film having a thickness of 1.0 nm.

(3) Specimen 3: a laminated film of a $Co_{90}Fe_{10}$—Pt layer having a thickness of 1.8 nm, a Ru film having a thickness of 0.8 nm, a $Co_{90}Fe_{10}$—Pt layer having a thickness of 1.5 nm, a Ru film having a thickness of 0.8 nm, and a $[Co_{20}Fe_{80}]_{80}B_{20}$ film having a thickness of 1.0 nm.

(4) Specimen 4: a laminated film of a Co—Pt layer having a thickness of 2.1 nm, a Ru film having a thickness of 0.8 nm, a Co—Pt layer having a thickness of 1.7 nm, a Ru film having a thickness of 0.8 nm, and a $[Co_{60}Fe_{40}]_{80}B_{20}$ film having a thickness of 1.0 nm.

The structures of the layers other than the magnetization fixing layer 15 are as follows in each of the specimens 1 to 4.

(1) The base layer 14: a laminated film of a Ta film having a thickness of 5 nm, and a Ru film having a thickness of 10 nm.

(2) The tunnel insulating layer 16: a magnesium oxide film having a thickness of 1.2 nm.

(3) The storage layer 17: a $[Co_{20}Fe_{80}]_{80}B_{20}$ film having a thickness of 1.0 nm.

(4) The cap layer 18: a laminated film of a Ru film having a thickness of 5 nm, and a Ta film having a thickness of 3 nm.

Each of the specimens 1 to 4 was manufactured in such a way that a thermally-oxidized film having a thickness of 300 nm was formed on a silicon substrate having a thickness of 0.725 mm, and the storage element 3 having the structure described above was formed on the thermally-oxidized film thus formed. In addition, a Cu film having a thickness of 100 nm (becoming the word line which will be described later) (not shown) was provided between the base layer 14 and the silicon substrate.

Each of the layers other than the insulating layer 16 made from the magnesium oxide film was deposited by using the DC magnetron sputtering method.

The insulating layer 16 made from the magnesium oxide (MgO) film was deposited by using the RF magnetron sputtering method.

In addition, after the layers of the storage element 3 were deposited, a heat treatment was carried out within the heat-treating furnace in the magnetic field.

Next, after the word line portion was masked by utilizing the photolithography, the selective etching was carried out for the laminated film of a portion other than the word line by using the Ar plasma, thereby forming the word line (the lower electrode).

In this case, the portion other than the word line was etched to a depth of 5 nm of the substrate.

After that, a mask for a pattern of the storage element 3 was formed by using the electron beam lithography system, and the selective etching was carried out for the laminated film, thereby forming the storage element 3. A portion other than the storage element 3 was etched to a depth right above the Cu layer composing the word line.

It is noted that since the sufficient current needs to be caused to flow through the storage element for evaluation of the characteristics in order to generate the spin torque necessary for the magnetization reversal, it is necessary to suppress the resistance value of the tunnel insulating layer. Then, a circular shape having a diameter (size) of 0.04 μm was used as the pattern of the storage element 3 so that the areal resistance value (Ωμm$^2$) become 10 Ωμm$^2$.

Next, the portion other than the storage element 3 was insulated by the $Al_2O_3$ film having a thickness of about 100 nm in the sputtering process. After that, the bit line becoming the upper electrode, and the pads for measurement were formed by using the photolithography. In such a way, each of the specimens of the storage element 3 was manufactured.

The composition of the Co—Fe—B ternary alloy composing the storage layer was set to $[Co_{20}Fe_{80}]_{80}B_{20}$ (the content of each of the elements is expressed in a unit of at %).

The evaluation of the characteristics was carried out for the specimens of the storage element 3 which had been manufactured so far in the following manner.

Prior to the measurements, for the purpose of enabling a value in a plus direction and a value in a minus direction of an inversion current to be controlled so as to be symmetrical, a structure was adopted such that the magnetic field can be applied from the outside to the storage element 3. In addition, the voltage applied to the storage element 3 was set so as to become up to 1 V within the range in which the insulating layer 16 was not broken down.

(Measurements about Magnetization Curve)

The magnetization curve of the storage element 3 was measured by the Vibrating Sample Magnetometer (VSM) measurement using the VSM. At this time, the element which was obtained through the fine patterning was not used for the measurements, but a bulk film portion having a size of about 8 mm×about 8 mm and specially provided for the evaluation of the magnetization curve on the wafer was used for the measurements. In addition, the magnetic field for the measurements was applied either in a direction vertical to the film surface or in a direction parallel with the film surface.

(Measurements about Magnetoresistance Curve)

The element resistance was measured while the magnetic field was applied to the bulk film portion of the storage element, thereby evaluating the magnetoresistance curve of the storage element.

(Measurements about Inverse Current Value and Thermal Stability)

For the purpose of evaluating the write characteristics of the storage element 3 in the embodiment, a measurement of the inversion current value was carried out.

A current having a pulse width of 10 μs to 100 ms was caused to flow through the storage element 3, and the subsequent resistance value of the storage element 3 was measured. In addition, while the value of the current caused to flow through the storage element 3 was changed, the current value was obtained at which the direction of the magnetization M17 of the storage layer 17 of the storage element 3 was reversed. Also, a value obtained by extrapolating the pulse width dependency of the current value thus obtained into the pulse width of 1 ns was used as the inversion current value.

In addition, a gradient of the pulse width dependency of the inversion current value corresponds to the above index Δ of the thermal stability of the storage element 3. This means that, when the inversion current value is not further changed by the pulse width (as the gradient is smaller), the storage element 3 is strong against the thermal disturbance.

Also, for the purpose of taking the dispersion among the storage elements 3 into consideration, about 20 storage elements 3 having the same structure were manufactured, and the measurements described above were carried out, thereby obtaining average values of the inversion current values, and the indices Δ of the thermal stability.

Figure 6A:
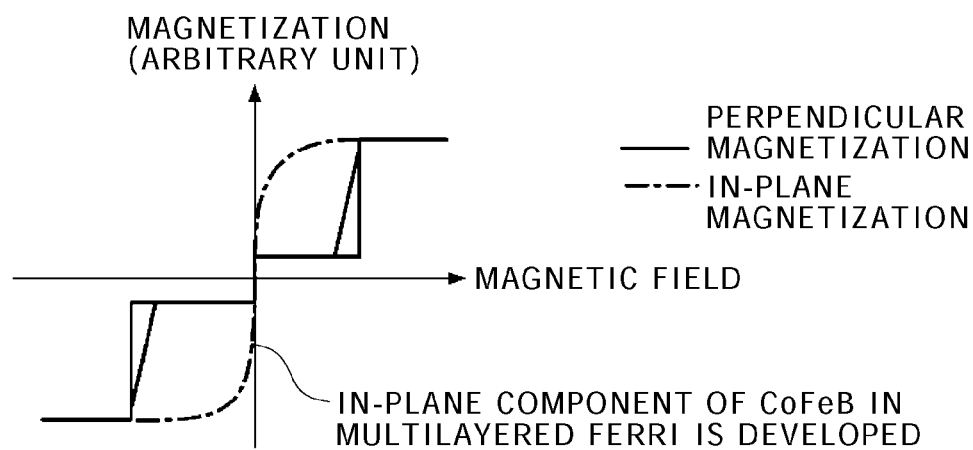
FIGS. 6A and 6B are respectively graphical representations showing magnetization curves when a magnetization fixing layer having a size of 0.04 μm×0.04 μm (storage element) has a multilayered ferri-pin structure, and showing a difference in characteristics due to a difference in amount of Fe of Co—Fe—B in the multilayered ferri-pin structure.
Figure 6B:
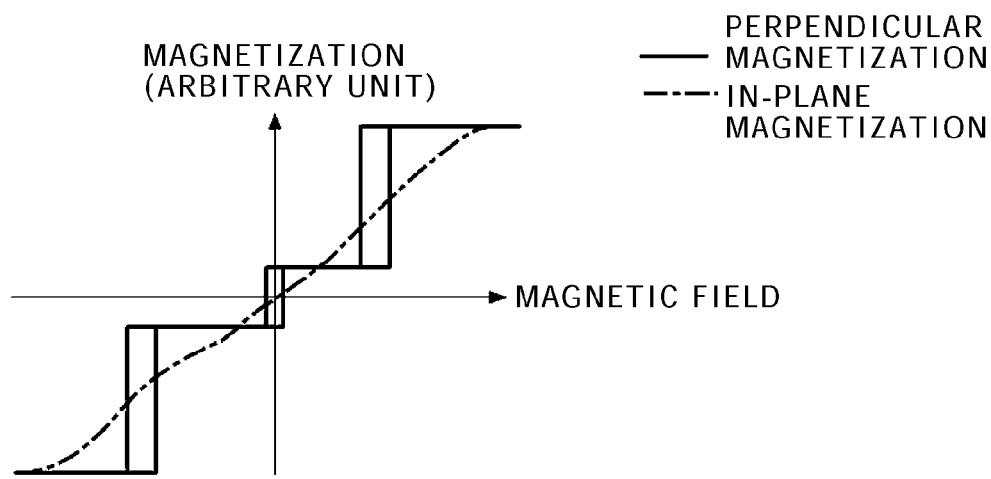

FIGS. 6A and 6B show the magnetization curves obtained about the specimen 3 and the specimen 4, respectively. FIG. 6A shows the measurement results about the magnetization curves of the specimen 4. Also, FIG. 6B shows the measurement results about the magnetization curves of the specimen 3. In each of FIGS. 6A and 6B, a solid line indicates the perpendicular magnetization, and a chain line indicates the in-plane magnetization. Referring to FIG. 6A, the magnetic component in the in-plane direction is generated in the specimen 4, and thus the specimen 4 is not practical. On the other hand, referring to FIG. 6B, the magnetic component in the in-plane direction is suppressed in the specimen 3, and thus the perpendicular magnetic anisotropy is strengthened.

Table 5 shows the results of the measurements about the perpendicular anisotropy magnetic fields, and the in-plane anisotropy magnetic fields of the specimens 1 to 4. When a ratio of the perpendicular anisotropy magnetic field to the in-plane anisotropy magnetic field is equal to or larger than 1, this means that there is the in-plane magnetic field component. Therefore, it is necessary for this ratio to be smaller than 1. In the case of each of the specimens 1 to 3, the ratio is smaller than 1 and thus each of the specimens 1 to 3 fulfills this requirement. On the other hand, the specimen 4 does not fulfill this requirement.

TABLE 5

|  | The number of magnetic layers in fixing layer | Tunnel barrier layer interface |
|---|---|---|
| (reference) No multilayered ferri | 1 | $[Co_{20}Fe_{80}]_{80}B_{20}$ |
| Specimen 1 | 2 | $[Co_{20}Fe_{80}]_{80}B_{20}$ |
| Specimen 2 | 2 | $[Co_{20}Fe_{80}]_{80}B_{20}$ |
| Specimen 3 | 3 | $[Co_{20}Fe_{80}]_{80}B_{20}$ |
| Specimen 4 | 3 | $[Co_{60}Fe_{40}]_{80}B_{20}$ |

|  | Perpendicular anisotropy magnetic field [Oe] (A) | In-plane anisotropy magnetic field [Oe] (B) | A/B |
|---|---|---|---|
| (reference) No multilayered ferri | 200 (coercive force of fixing layer) | — | — |
| Specimen 1 | 3030 | 8520 | 0.36 |
| Specimen 2 | 2370 | 7720 | 0.30 |
| Specimen 3 | 4900 | 8870 | 0.55 |
| Specimen 4 | 5360 | 1000 | 5.36 |

From the foregoing, the component of the Co—Fe—B alloy in the interface between the tunnel barrier layer and the magnetization fixing layer is suitably selected, whereby the diamagnetic field component in the film is reduced, and thus the perpendicular magnetic anisotropy is strengthened.

Figure 7A:
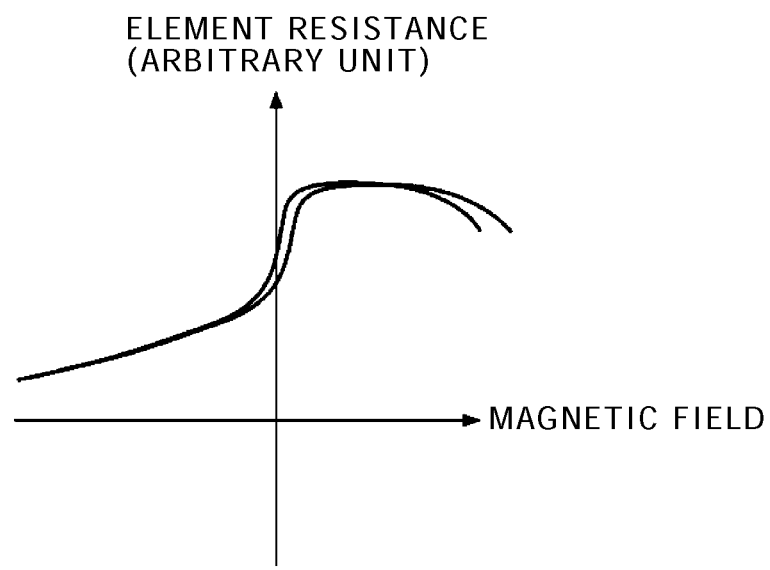
FIGS. 7A and 7B are respectively graphical representations showing a change in element resistance when the magnetization fixing layer having a size of 0.04 μm×0.04 μm (storage element) has the multilayered ferri-pin structure, and showing a difference in characteristics due to a difference in amount of Fe of Co—Fe—B in the multilayered ferri-pin structure.
Figure 7B:
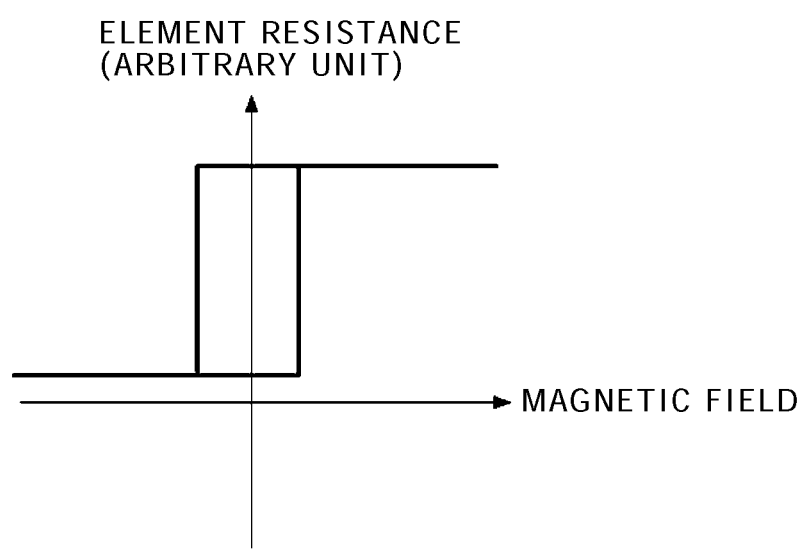

FIGS. 7A and 7B show the magnetoresistance curves obtained about the specimen 3 and the specimen 4, respectively. FIG. 7A shows the results of the measurements about the specimen 4. Also, FIG. 7B shows the results of the measurements about the specimen 3.

Referring to FIG. 7A, a change in element resistance is dull against a change in magnetic field. On the other hand, referring to FIG. 7B, the change in element resistance is sharp against the change in magnetic field.

From this, it is understood that the specimen 3 has the sufficient magnetoresistance change rate (MR rate).

Table 6 shows values of the coercive force, and Δ as the index of the thermal stability. From Table 6, it is understood that the necessary numerical values are ensured.

TABLE 6

|  | R—H characteristics Hc[Oe] | Thermal stability Δ |
|---|---|---|
| Specimen 1 | 140 | 40 |
| Specimen 2 | 100 | 31 |
| Specimen 3 | 136 | 41 |
| Specimen 4 | 40 | 0 (no magnetization reversal by spin injection) |

Although the embodiment has been described so far, the present application is by no means limited to the film structures of the storage element 3 shown in the embodiment described above, and thus the present application can adopt various kinds of layer structures.

For example, although in the embodiment described above, the components of the Co—Fe—B ternary alloys in the storage layer 17 and the magnetization fixing layer 15 are made identical to each other, the present application is by no means limited to the embodiment described above, and thus other various kinds of structures can be adopted without departing from the subject matter.

In addition, although in the embodiment described above, only the single base layer 14, the cap material, and the shape of the storage element are shown, the present application is by no means limited thereto, any other suitable structure can be adopted without departing from the subject matter.

In addition, although in the embodiment described above, the magnetization fixing layer 15 adopts the multilayered ferri-pin structure composed of the ferromagnetic layer and the nonmagnetic layer composing either the two or three layers, the multilayer composed of the two or three layers or more may also be adopted. In addition, a structure may also be adopted such that the antiferromagnetic film is added to the multilayered ferri-pin structure.

In addition, there is no problem at all even in the structure that the storage layer 17 is disposed on the lower side of the magnetization fixing layer 15, or even in the structure that the storage layer 17 is disposed on the upper side of the magnetization fixing layer 15. Moreover, there is no problem at all even in the so-called dual structure that the magnetization fixing layers 15 exist on the upper and lower sides of the storage layer 17, respectively.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A storage element, comprising:
   a storage layer which has magnetization vertical to a film surface and in which a direction of the magnetization is changed in correspondence to information;
   a magnetization fixing layer which has a fixed magnetization direction that is vertical to a film surface becoming a reference of the information stored in said storage layer, the magnetization fixing layer having a multilayered ferri-pin structure in which a plurality of magnetic layers are laminated one upon another through at least one non-magnetic layer; and
   an insulating layer made of a non-magnetic material and provided between said storage layer and said magnetization fixing layer, wherein
   the direction of the magnetization of said storage layer is changed by injecting spin-polarized electrons in a lamination direction of a layer structure having said storage layer, said insulating layer, and said magnetization fixing layer, thereby recording information in said storage layer, and
   a magnitude of an effective diamagnetic field which said storage layer receives is smaller than an amount of saturation magnetization of said storage layer.

2. The storage device according to claim 1, wherein the plurality of magnetic layers in the multilayered ferri-pin structure includes a magnetic layer located in an interface with the insulating layer, and wherein the storage layer and the magnetic layer are each composed of Co—Fe—B.

3. The storage device according to claim 2, wherein a composition of Co—Fe—B in the storage layer and the magnetic layer is $(Co_xFe_y)_{100-z}B_z$ where $0 \leq x \leq 40$, $60 \leq y \leq 100$, and $0 < z \leq 30$.

4. A memory device, comprising
   a storage element holding information based on a magnetization state of a magnetic material, and
   two kinds of wirings intersecting with each other, wherein
   said storage element includes: a storage layer which has magnetization vertical to a film surface and in which a direction of the magnetization is changed in correspondence to information; a magnetization fixing layer which has a fixed magnetization direction that is vertical to a film surface becoming a reference of the information stored in said storage layer, the magnetization fixing layer having a multilayered ferri-pin structure in which a plurality of magnetic layers are laminated one upon another through at least one non-magnetic layer; and an insulating layer made of a non-magnetic material and provided between said storage layer and said magnetization fixing layer; the direction of the magnetization of said storage layer is changed by injecting spin-polarized electrons in a lamination direction of a layer structure having said storage layer, said insulating layer, and said magnetization fixing layer, thereby recording information in said storage layer; and a magnitude of an effective diamagnetic field which said storage layer receives is smaller than an amount of saturation magnetization of said storage layer,
   said storage element is disposed between said two kinds of wirings, and
   a current is caused to flow through said storage element in the lamination direction through said two kinds of wirings, thereby injecting the spin-polarized electrons.

5. The storage device according to claim 1, wherein the insulating layer comprises a magnesium oxide.

6. The storage device according to claim 1, wherein an area of the storage element is less than or equal to 0.01 $\mu m^2$.

7. The storage device according to claim 1, wherein each of the plurality of magnetic layers in the multilayered ferri-pin structure comprises a material selected from the group consisting of: Co, Co—Pt, Co—Fe—Pt, Co—Fe and Co—Fe—B.

8. The storage device according to claim 1, wherein the nonmagnetic layer comprises a material selected from the group consisting of: ruthenium, rhenium, iridium and osmium.

* * * * *